United States Patent [19]

Anderson et al.

[11] Patent Number: 5,700,623
[45] Date of Patent: Dec. 23, 1997

[54] THERMALLY STABLE PHOTOGRAPHIC BAR CODE LABEL CONTAINING AN ANTISTATIC LAYER

[75] Inventors: Charles C. Anderson, Penfield; Lawrence J. Steinwachs; Gary W. Schum, both of Rochester, all of N.Y.

[73] Assignee: Eastman Kodak Company, Rochester, N.Y.

[21] Appl. No.: 786,512

[22] Filed: Jan. 21, 1997

[51] Int. Cl.$^6$ .................................................. G03C 1/805
[52] U.S. Cl. ............................ 430/256; 430/257; 430/259
[58] Field of Search ................................ 430/256, 257, 430/259

[56] References Cited

U.S. PATENT DOCUMENTS

| | | | |
|---|---|---|---|
| 3,033,679 | 10/1962 | Laakso et al. | 430/429 |
| 3,437,484 | 4/1969 | Nadeau | 430/496 |
| 3,525,621 | 8/1970 | Miller | 430/529 |
| 3,630,740 | 12/1971 | Joseph et al. | 430/528 |
| 3,681,080 | 8/1972 | Nakazawa et al. | 430/547 |
| 4,070,189 | 1/1978 | Kelley et al. | 252/500 |
| 4,237,194 | 12/1980 | Upson et al. | 428/424.2 |
| 4,275,103 | 6/1981 | Tsubusaki et al. | 428/148 |
| 4,308,332 | 12/1981 | Upson et al. | 430/62 |
| 4,394,441 | 7/1983 | Kawaguchi et al. | 430/524 |
| 4,416,963 | 11/1983 | Takimoto et al. | 430/69 |
| 4,418,141 | 11/1983 | Kawaguchi et al. | 430/530 |
| 4,431,764 | 2/1984 | Yoshizumi | 430/409 |
| 4,495,276 | 1/1985 | Takimoto et al. | 430/527 |
| 4,526,706 | 7/1985 | Upson et al. | 252/500 |
| 4,542,095 | 9/1985 | Steklenski et al. | 430/527 |
| 4,571,361 | 2/1986 | Kawaguchi et al. | 428/328 |
| 4,584,238 | 4/1986 | Gen et al. | 428/349 |
| 4,693,954 | 9/1987 | Naito | 430/203 |
| 4,772,512 | 9/1988 | Nagafuchi | 428/331 |
| 4,915,994 | 4/1990 | Begelfer et al. | 428/40 |
| 4,916,011 | 4/1990 | Miller | 428/341 |
| 4,980,229 | 12/1990 | Park et al. | 428/327 |
| 4,999,276 | 3/1991 | Kuwabara et al. | 430/264 |
| 5,122,445 | 6/1992 | Ishigaki | 430/523 |
| 5,273,798 | 12/1993 | Miner | 428/473.5 |
| 5,368,994 | 11/1994 | Fujiwara et al. | 430/508 |

OTHER PUBLICATIONS

Research Disclosure No. 34458, Dec. 1992, M. Stevens et al.

*Primary Examiner*—Hoa Van Le
*Attorney, Agent, or Firm*—Carl F. Ruoff

[57] ABSTRACT

The present invention is a bar code label including an opaque polymer film substrate having a first side and a second side. A first primer layer is superposed on the first side of the opaque polymer film substrate and a light-sensitive silver halide photographic emulsion layer is superposed on the first primer layer. The light-sensitive photographic emulsion contains silver halide grains, a hydrophilic colloid, a polymer latex and a hardener. An overcoat layer is superposed on the light-sensitive photogahpic emulsion layer and includes a hydrophilic colloid and an image stabilizer. A second primer layer is superposed on the second side of the opaque polymer film and an antistatic layer is superposed on the second primer layer. The antistatic layer includes a polymeric binder and an antistatic agent. A pressure sensitive adhesive layer is superposed on the antistatic layer and a removable release sheet is superposed on the pressure sensitive adhesive layer.

24 Claims, 1 Drawing Sheet

THERMALLY STABLE PHOTOGRAPHIC BAR CODE LABEL CONTAINING AN ANTISTATIC LAYER

FIELD OF THE INVENTION

This invention relates to thermally stable labels, and more particularly, to thermally stable bar code labels containing a silver halide photographic imaging layer and an antistatic layer. These labels are especially suited for use on articles that are exposed to high temperatures during and after the manufacture of the article, such as circuit boards and are especially useful in the manufacture of rubber tires.

BACKGROUND OF THE INVENTION

The manufacture of articles such as printed circuit boards and rubber tires is a highly automated process that involves high temperature curing. As disclosed in U.S. Pat. No. 5,273,798, in order to enable the manufacturers to track each article through the entire course of the automated manufacturing process, as well as to facilitate real time tracking of inventory and shipping for the manufactured article, bar code labels are applied to the "green" or uncured article at the beginning of the manufacturing process. In the manufacture of rubber tires, for example, the curing or vulcanization process subjects the label to very high temperatures, cure temperatures of 300° to 400° F. are typical. The bar code image must not degrade as a result of exposure to this high temperature environment to insure that the bar Code remains scannable. The label must remain firmly attached to the cured rubber tire when it is removed from the press while still hot, and must not curl, shrink, or lift from the tire as the label and the tire cool. From the time that the label is first applied to the green rubber tire the bar code may be scanned many dozens of times during the manufacturing process. Therefore, the bar code label must be resistant to wear and abrasion so that there is no loss in scannability over time.

Conventional bar code labels typically comprise a paper or polymer film substrate with an image receptive coating on one side of the substrate and on the opposite side, in order outward from the substrate, an adhesive layer, which is usually a pressure-sensitive adhesive layer, and a removable release sheet. The bar code image is printed on the image receptive coating using a dot matrix impact printer, injet printer, or electrostatic printer, for example.

Labels containing printed bar code images have been described for use during the manufacture of printed circuit boards. U.S. Pat. No. 5,273,798 describes a heat and solvent resistant pressure-sensitive label for use in printed circuit board manufacture comprising a thermally stable polymer film substrate such as a polyimide or polysulfone film containing a print receptive coating on one side of the polymer film and a curable, pressure-sensitive elastomeric adhesive on the other side of the polymer film. U.S. Pat. No. 4,915,994 describes a dimensionally stable, pressure-sensitive label having a complex laminate structure for use in printed circuit board manufacture that comprises, in order, a heat resistant polymer film cover sheet, an adhesive layer, an unplasticized polyvinyl chloride face stock that has been printed with the bar code image, a second adhesive layer, and a liner backing paper which is removed prior to applying the label to the green circuit board by means of the second adhesive layer. Other pressure-sensitive labels containing conventional, dot matrix, ink jet, or electrostatographic printed bar code images are described in U.S. Pat. Nos. 4,584,238, 4,772,512, and 4,980,229.

Conventional bar code labels utilizing such printed bar code images described in the abovementioned prior art have been found to be limited in their ability to retain image integrity under the severe processing conditions involved in the vulcanization of rubber tires.

Photographic materials suitable for the production of thermostable photographic bar codes are disclosed in *Research Disclosure*, Item 34458, December 1992. In this disclosure, a transparent polyethylene terephthalate support is provided with conventional primer and subbing layers. In a typical laminate arrangement the transparent support is coated with a reflective layer containing a whitening agent. Upon this layer the silver halide emulsion layer is applied which itself bears a protective overcoat layer. The emulsion layer is orthochromatically sensitized and contains a fluorescent brightening agent. A backing layer may be present on the non-light sensitive side of the support, which itself may be whitened. An alternative layer arrangement is also disclosed in which the white reflective layer is coated Upon the emulsion layer instead of underneath the emulsion layer. The bar code forming emulsion layer is therefore sandwiched between support and reflective layer and must be exposed through the back side. In the first layer arrangement an adhesive layer is provided on the backing layer to adhere the bar code label to the item to be labeled. In the second layer arrangement the adhesive would need to be applied onto the white reflective layer. Such photographic bar code materials are prone to the generation of static electric charges during the manufacture of the bar code material. Such static charges may discharge at any point during the manufacture of the label prior to developing the bar code image thus making the bar code label nonuseable.

The problems of static charging and discharging in photographic films is well known. To help control these problems it is conventional practice to provide an antistatic layer on photographic films. Many antistatic agents have been utilized for the purpose. For example, an antistatic layer comprising an alkali metal salt of a copolymer of styrene and styrylundecanoic acid is disclosed in U.S. Pat. No. 3,033,679. Photographic films having a metal halide, such as sodium chloride or potassium chloride, as the conducting material, in a hardened polyvinyl alcohol binder are described in U.S. Pat. No. 3,437,484. In U.S. Pat. No. 3,525,621, the antistatic layer is comprised of an alkyaryl polyether sulfonate, an alkali metal salt of an arylsulfonic acid, or an alkali metal salt of a polymeric carboxcylic acid. An antistatic layer comprised of an anionic film forming polyelectroyte, colloidal silica and a polyalkylene oxide is disclosed in U.S. Pat. No. 3,630,740. in U.S. Pat. No. 3,681,080, an antistatic layer is described in which the antistatic agent is a copolymer of styrene and styrenesulfonic acid. U.S. Pat. No. 4,542,095 describes antistatic compositions comprising a binder, a nonionic surface-active polymer having polymerized alkylene oxide monomers and an alkali metal salt. In U.S. Pat. No. 4,916,011, an antistatic layer comprising a styrene sulfonate-maleic acid copolymer, a latex binder, and a alkyl-substituted trifunctional aziridine cross-linking agent is disclosed. U.S. Pat. Nos. 4,237,194, 4,308,332, and 4,526,706 describe antistats based on polyaniline salt-containing layers. Crosslinked vinylbenzyl quaternary ammonium polymer antistatic layers are described in U.S. Pat. No. 4,070,189.

Antistatic layers containing conductive metal-containing particles have also been described. Examples of useful electrically conductive metal-containing particles include donor-doped metal oxides, metal oxides containing oxygen deficiencies, and conductive nitrides, carbides, and bromides. Specific examples of particularly useful particles include conductive $TiO_2$, $SnO_2$, $V_2O_5$, $Al_2O_3$, $ZrO_2$, $In_2O_3$, ZnO, $ZnSb_2O_6$, $InSbO_4$, $TiB_2$, $ZrB_2$, $NbB_2$, $TaB_2$, CrB, MoB, WB, $LaB_6$, ZrN, TiN, WC, HfC, HfN, and ZrC. Examples of the patents describing these electrically conductive particles include; U.S. Pat. Nos. 4,275,103, 4,394,441, 4,416,963, 4,418,141, 4,431,764, 4,495,276, 4,571,361, 4,999,276, 5,122,445 and 5,368,995.

However, the abovementioned prior art references do not teach or suggest the use of antistatic layers in thermally stable bar code labels, nor what antistatic layer compositions are especially suited for a bar code label used in the manufacture of rubber tires and printed circuit boards.

It is an object of the present invention to provide a thermally stable bar code label for use on articles that are exposed to high temperatures during the manufacture or use of the article. It is another object of the invention to provide a bar code label that is easily manufactured and is resistant to the formation of bar code image defects during the manufacture of the label.

SUMMARY OF THE INVENTION

The present invention is a bar code label including an opaque polymer film substrate having a first side and a second side. A first primer layer is superposed on the first side of the opaque polymer film substrate and a light-sensitive silver halide photographic emulsion layer is superposed on the first primer layer. The light-sensitive photographic emulsion contains silver halide grains, a hydrophilic colloid, a polymer latex and a hardener. An overcoat layer is superposed on the light-sensitive photogaphic emulsion layer and includes a hydrophilic colloid and an image stabilizer. A second primer layer is superposed on the second side of the opaque polymer film and an antistatic layer is superposed on the second primer layer. The antistatic layer includes a polymeric binder and an antistatic agent. A pressure sensitive adhesive layer is superposed on the antistatic layer and a removable release sheet is superposed on the pressure sensitive adhesive layer.

Figure 1:
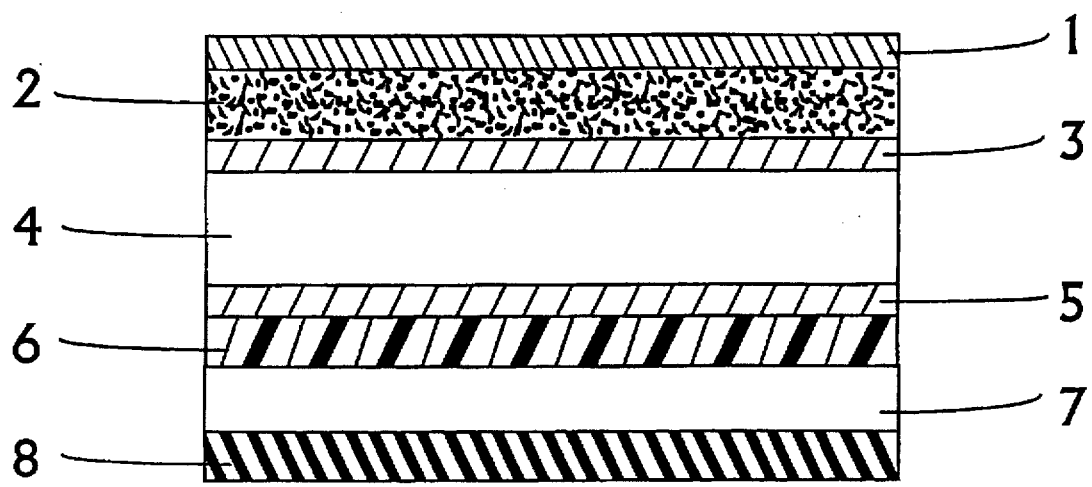
FIGURE 1 is a schematically illustrated cross-sectional view of the components of the bar code label of the invention.

For a better understanding of the present invention together with other objects and advantages, reference is made to the following detailed description.

DETAILED DESCRIPTION OF THE INVENTION

The present invention provides a novel, thermally stable bar code label especially suited for use in the manufacture of articles that are exposed to high temperatures. The label has exceptional image stability under the extremely harsh conditions employed, for example, in the vulcanization of rubber tires. The label of the invention adheres tenaciously to the thermally processed article, for example, a cured rubber tire. The label includes an opaque polymer film substrate and a silver halide photographic emulsion layer that forms the bar code image. In addition, the improved bar code label of the invention includes an antistatic backing layer that prevents the generation of static electric charges and possible static discharge-induced defects in the bar code image, thus improving the manufacturability of the label. The antistatic backing layer of the invention also provides exceptional adhesion to the opaque substrate and to the curable, pressure-sensitive adhesive layer that overlies the backing layer.

In accordance with the present invention, a bar code label comprises an opaque polymer film substrate, having on one side a silver halide photographic emulsion imaging layer and a protective overcoat, and on the side opposite to the imaging layer, an antistatic backing layer. After exposure and processing of the bar code image, the backing layer is overcoated with a curable, pressure-sensitive adhesive layer, and a release sheet that overlies the said adhesive layer. The release sheet is removed prior to applying the bar code label to the article to be manufactured or cured at high temperature. The bar code labels of the present invention are especially useful in the manufacture of rubber tires, such labels adhere tenaciously to vulcanized rubber tires and their bar code image is not degraded during the vulcanization process.

Referring to the drawing in FIGURE 1, which illustrates the assembled bar code label of the invention, the opaque polymer film substrate 4 is provided with primer layers 3 and 5 on its front and back surfaces, respectively. Substrate thicknesses of 25 to 250 µm (0.001 to 0.010 inches) can be used. Preferably, the substrate thickness is 50 to 150 µm. A substrate useful in the present invention is polyethylene terephthalate that is rendered opaque by incorporation of an effective amount of an opacifying agent into the polymer. Preferrably, the opacifying agent is capable of generating a voided stucture of discrete, closed cells. Suitable voiding agents, which also provide opacity, include an organic filler, a particulate inorganic filler, or a combination of two or more such fillers. Particulate inorganic fillers suitable for generating an opaque, voided substrate include conventional inorganic pigments such as alumina, silica, titania, and alkaline metal salts such as calcium salts and barium salts. Barium sulfate is a particularly preferred filler for generating an opaque and voided substrate. Production of opaque, voided substrates useful in the present invention are further described, for example, in U.S. Pat. No. 5,411,845.

Preferably, primer layers 3 and 5 have the same composition. However, it is possible to use different primer layer compositions on the front and back side of the substrate in order to provide the best adhesion to the layers that will overly them. The primer layers, also referred to as undercoat layers, useful in the present invention can be any of the primer layers described in the photographic art. For example, they can comprise the vinylidene chloride-containing interpolymers taught in U.S. Pat. Nos. 2,627,088, 2,698,235, 2,698,240, 2,943,937, 3,143,421, 3,201,249, 3,271,178 and 3,501,301; the N-substituted monoallylamine polymers taught in U.S. Pat. No. 5,411,845; the polymeric amine and polyepoxy taught in U.S. Pat. No. 4,857,568; and others.

Although not shown in FIGURE 1, a gelatin-containing subbing layer which is well known in the photographic art may be interposed between primer layer 3 and the silver halide photographic emulsion layer 2 in order to improve adhesion. Preferably, for the purpose of the present invention, the silver halide emulsion layer is applied directly onto primer layer 3. In this case, the primer layer may be energy treated with a corona or plasma discharge just prior to overcoating with the emulsion layer in order to improve adhesion.

The silver halide photographic emulsion layer 2 contains an orthochromatically sensitized, high-speed silver halide emulsion. The silver halide emulsion can include silver halide grains of any known configuration, including regular octahedral, cubic, or tabular grains, as described in *Research Disclosure*, item 22534, January 1983. In the present invention, the silver halide is a silver bromoiodide, preferably, the emulsion is composed of 99:1 bromide:iodide mole %. The emulsions typically will be gelatin emulsions although other hydrophilic colloids can be used in accordance with usual practice.

In addition to the silver halide grains and hydrophilic colloid, the silver halide emulsion layer employed in this invention also includes a polymer latex to improve the dimensional stability of the bar code material. The polymer latex is an aqueous dispersion of a water-insoluble polymer. It is incorporated in the emulsion layer in an amount of from about 0.2 to 1.5 parts per part of the hydrophilic colloid. Preferably, the polymer latex is an interpolymer of an alkyl acrylate having a glass transition temperature below 20° C.

The silver halide emulsion layer also contains a crosslinking agent or hardener. Effective hardeners for gelatin and other hydrophilic colloids are well known in the art and include, for example, aziridines, carbodiimides, aldehydes such as formaldehyde and glutaraldehyde, triazines and diazines, vinyl sulfones, and others as described in *Research Disclosure*, Item 36544, September 1994.

The thickness range for the silver halide emulsion layer employed in the invention is typically in the range of from about 1 to about 9 μm, and more preferably in the range of from about 2 to 4 μm.

The emulsion layer is overcoated with a protective layer 1 which contains a hydrophilic colloid such as gelatin, an image stabilizer, filter dye, wetting aid, organic or inorganic matting agents, and lubricants such as silicone compounds, higher fatty acids and derivatives, paraffin or wax-like materials, or perfluoro- or fluoro-containing materials. The thickness range for the protective layer is typically about 0.5 to 2 μm.

The function of the image stabilizer incorporated in the protective layer is to maintain the processed density (i.e., $D_{max}$) of the bar code image under the high temperature conditions of, for example, the rubber tire vulcanization process. The use of stabilizers in silver halide emulsion layers or contiguous layers is well known in the photographic art and described, for example, in *Research Disclosure*, Item 308119, December 1989. Preferably, for the purpose of the present invention the stabilizer is a dithiaurazole.

On the side of the opaque substrate opposite to the photographic emulsion layer is an antistatic backing layer 6. The antistatic backing layer must prevent the generation of static electric charges and possible static discharge-induced defects in the bar code image and provide exceptional adhesion to the opaque substrate primer layer and to the curable, pressure-sensitive adhesive layer 7 that overlies the backing layer. The antistatic backing layer has a surface electrical resistivity of $5 \times 10^{11}$ Ω/□ or less measured at a relative humidity of 50%.

The backing layer comprises an antistatic agent and a polymeric binder. The backing layer may additionally contain coalescing aid, wetting aid, matting agent, rheology modifiers, crosslinking agents and lubricant. Preferably, the backing layer is applied from aqueous medium.

Although a wide variety of antistatic agents have been found to be useful for photographic applications, for the purpose of the present invention it is preferable to use a polymeric antistatic agent in the backing layer in order to provide the best adhesion to the primer layer and the curable adhesive layer under the demanding conditions of the intended use of the bar code label. Especially preferred antistatic agents include the cross-linked vinylbenzyl quaternary ammonium polymers of U.S. Pat. No. 4,070,189, potassium cellulose succinate salts described in U.S. Pat. No. 4,459,352, or water soluble interpolymers of alkali metal salts of styrene sulfonic acid such as those described in U.S. Pat. Nos. 4,960,687, 4,891,308, 4,999,276, for example. Other suitable antistatic agents include polyacetylenes, polyanilines, polythiophenes and polypyrroles. These antistatic agent are described in U.S. Pat. Nos. 4,237,194, and 5,370,981, and Japanese Patent Applications 2282245 and 2282248.

Polymeric binders that are suitable for use in the antistatic backing layer include vinylidene chloride-containing interpolymers, and butadiene-containing interpolymers such as styrene-butadiene copolymers and acrylonitrile-butadiene copolymers. The glass transition temperature of the polymer binder is preferably 50° C. or lower. Polyesterionomers and polyurethanes, which have been described as polymeric binders for antistatic agents in the photographic and imaging art, see for example, U.S. Pat. Nos. 5,203,884, 5,322,761, 5,372,985, 5,407,603, 5,424,269, 5,427,835, 5,439,785, 5,468,498, and 5,547,821, are less desirable polymeric binders for the antistatic backing layer of the present invention since they provide poor adhesion of the bar code label to the thermally cured article.

The antistatic backing layer comprises about 1 part to 20 parts antistatic agent per 10 parts of polymeric binder. The thickness range for the antistatic backing layer is about 0.05 to about 5 μm, preferably 0.1 to 1.0 μm.

After exposure of the bar code and developing the image in a conventional film processor such as a rapid access processor that is well known in the graphic arts industry, the pressure-sensitive adhesive layer 7 is applied onto the antistatic backing layer. The curable, pressure-sensitive adhesive layer contains an elastomeric polymer that is curable at high temperature, such as during the rubber tire vulcanization process. Suitable polymers include EPDM (ethylene-propylene-diene monomer) rubbers, styrene-butadiene rubbers, nitrile rubbers, chloroprene, acrylate or methacrylate elastomers, and the like. The adhesive layer may contain other components that are well known in adhesive technology such as inorganic fillers, antioxidants, fungicides, uv stabilizers, surfactants, and the like. Onto the pressure-sensitive adhesive layer is applied a removable paper or polymeric film release sheet 8.

The present invention will now be described in detail with reference to examples; however, the invention should not be limited to these examples.

EXAMPLES

The following bar code labels were prepared by applying an antistatic backing layer onto a 100 μm thick opaque polyethylene terephthalate substrate that had been previously coated with primer layer on both sides. This primer layer-coated opaque substrate is commercially available as Melinex 534, from ICI Films of Wilmington, Del. The polymeric binders and antistatic agents used in the antistatic backing layers of the example and comparative bar code labels are given in Table 1 and Table 2.

TABLE 1

Polymeric Binders

| Binder | Description |
| --- | --- |
| P-1 | acrylonitrile/vinylidene chloride/acrylic acid latex |
| P-2 | acrylonitrile/vinylidene chloride cationic latex |
| P-3 | styrene-butadiene latex, carboxylated |
| P-4 | Witcobond 232 aqueous polyurethane, available form Witco Corp. |
| P-5 | AQ55D polyesterionomer aqueous dispersion, available from Eastman Chemical Co. |
| P-6 | n-butyl methacrylate latex |

TABLE 2

Antistatic Agents

| Antistat | Description |
| --- | --- |
| A-1 | crosslinked vinylbenzyl trimethylammonium chloride latex |
| A-2 | poly(sodium styrene sulfonate), available from National Starch Corp. |
| A-3 | poly(sodium styrene sulfonate-co-maleic acid), available from National Starch Corp. |
| A-4 | poly(potassium cellulose succinate) |
| A-5 | conductive antimony-doped tin oxide particles |

The following tests were conducted on each sample to evaluate performance. After the antistatic backing layer was coated onto the opaque substrate and dried, the surface resistivity of the antistatic backing layer was measured at 50% RH using a two-point probe.

In order to evaluate the adhesion of these antistatic backing layers to the opaque substrate and a curable elastomeric adhesive layer the following tests were conducted. The opaque substrate containing the coated antistatic backing layer was processed in a conventional rapid access processor to simulate the typical processing that would be performed on an actual photographic bar code material. Then, a curable, elastomeric pressure-sensitive adhesive was applied onto the antistatic backing layer to prepare a simulated bar code label. This label was applied onto a green rubber sample and cured to simulate the typical cure cycle used for rubber tire manufacture (300°–400° F.). The adhesion of the label to the cured rubber sample was evaluated while the sample was still hot and after it had cooled. The adhesion of the label was assessed as pass or fail based on the relative force required to peel the label.

Example 1

The antistatic backing layer comprised 20 weight % A-1 and 80 weight % P-2 and was applied at a dry coating weight of 200 mg/m$^2$.

Example 2

The antistatic backing layer comprised 40 weight % A-1 and 60 weight % P-2 and was applied at dry coating weight of 200 mg/m$^2$.

Example 3

The antistatic backing layer comprised 60 weight % A-1 and 40 weight % P-2 and was applied at a dry coating weight of 200 mg/m$^2$.

Example 4

The antistatic backing layer comprised 15 weight % A-1, 60 weight % P-2, 20 weight % ethylene carbonate coalescing aid, 4 weight % polymeric matte beads, and 1 weight % carnauba wax lubricant. The layer was applied at a dry coating weight of 250 mg/m$^2$.

Example 5

The antistatic backing layer comprised 33 weight % A-3 and 67 weight % P-1 and was applied at a dry coating weight of 200 mg/m$^2$.

Example 6

The antistatic backing layer comprised 50 weight % A-3 and 50 weight % P-1 and was applied at a dry coating weight of 400 mg/m$^2$.

Example 7

The antistatic backing layer comprised 50 weight % A-3 and 50 weight % P-3 and was applied at a dry coating weight of 400 mg/m$^2$.

Example 8

The antistatic backing layer comprised 50 weight % A-4 and 50 weight % P-1 and was applied at a dry coating weight of 100 mg/m$^2$.

Example 9

The antistatic backing layer comprised 50 weight % A-2 and 50 weight % P-1 and was applied at a dry coating weight of 100 mg/m$^2$.

Comparative Sample A

The antistatic backing layer comprised 50 weight % A-2 and 50 weight % P-5 and was applied at a dry coating weight of 100 mg/m$^2$.

Comparative Sample B

The antistatic backing layer comprised 50 weight % A-3 and 50 weight % P-5 and was applied at a dry coating weight of 100 mg/m$^2$.

Comparative Sample C

The antistatic backing layer comprised 70 weight % A-5 and 30 weight % P-5 and was applied at a dry coating weight of 250 mg/m$^2$.

Comparative Sample D

The antistatic backing layer comprised 70 weight % A-5 and 30 weight % P-4 and was applied at a dry coating weight of 250 mg/m$^2$.

Comparative Sample E

The antistatic backing layer comprised 50 weight % A-5 and 50 weight % P-6 and was applied at a dry coating weight of 250 mg/m$^2$.

Comparative Sample F

The antistatic backing layer comprised the antistatic backing formulation disclosed in U.S. Pat. No. 5,244,728. The backing is a mixture of a styrene/n-butyl methacrylate/sulfoethyl methacrylate terpolymer latex, colloidal silica, salt, and surfactant that has been found useful as an antistatic backing for photographic paper. The coating was applied at a dry coating weight of 320 mg/m$^2$.

The test results obtained for the examples and comparative samples are given in Table 3. The results clearly show that only antistatic backing layers of the invention provide the combination of surface resistivity values less than $5\times10^{11}$ Ω/□ and provide good hot and cold adhesion performance. Comparative samples employing various antistatic backing layer compositions described in the photographic art, although generally providing acceptable surface resistivity values, gave unacceptable adhesion results.

Example 10

An antistatic backing layer of the invention that comprised 15 weight % A-1, 60 weight % P-2, and 25 weight % ethylene carbonate coalescing aid was applied onto the aforementioned opaque substrate previously coated with primer layers. The backing layer was applied at a dry coating weight of 250 mg/m². On the side opposite to the backing layer was coated a high-speed, orthochromatic silver halide emulsion layer containing polymer latex. A gelatin-containing protective layer having a thickness of about 1 μm was applied onto the emulsion layer. The protective layer also contained dithiaurazole stabilizer, silica matting agent, silicone lubricant, and filter dye.

The above-prepared photographic material was exposed and processed in a conventional rapid access processor to form a bar code image. Then a curable, elastomeric pressure-sensitive adhesive was applied onto the antistatic backing layer to prepare a bar code label. This bar code label was applied onto a green rubber sample and cured at a temperature to simulate the typical cure cycle used for rubber tire manufacture.

Comparative Sample G

A label was prepared similar to that described in Example 10 except that an antistatic backing layer was not included. This sample is Comparative Sample G.

After rapid access processing these two label materials were inspected for evidence of static marks that might be present due to the generation and discharge of static electric charge during the manufacture and handling of the label. Example 10 of the invention showed no static marks, while Comparative Sample G showed static marks as a result of not having an antistatic backing layer.

After vulcanizing the rubber sample, the label of Example 10 had excellent image stability and excellent hot and cold adhesion.

TABLE 3

| Backing | Surface Resistivity, Ω/□ | Adhesion Hot | Adhesion Cold |
|---|---|---|---|
| Example 1 | $6.3 \times 10^9$ | Pass | Pass |
| Example 2 | $3.1 \times 10^8$ | Pass | Pass |
| Example 3 | $1.0 \times 10^8$ | Pass | Pass |
| Example 4 | $1.0 \times 10^{10}$ | Pass | Pass |
| Example 5 | $2.5 \times 10^{11}$ | Pass | Pass |
| Example 6 | $2.5 \times 10^8$ | Pass | Pass |
| Example 7 | $5.0 \times 10^8$ | Pass | Pass |
| Example 8 | $6.3 \times 10^9$ | Pass | Pass |
| Example 9 | $5.0 \times 10^9$ | Pass | Pass |
| Comparative Sample A | $2.5 \times 10^9$ | Fail | Fail |
| Comparative Sample B | $5.0 \times 10^8$ | Fail | Fail |
| Comparative Sample C | $1.6 \times 10^{11}$ | Fail | Pass |
| Comparative Sample D | $1.0 \times 10^{11}$ | Fail | Pass |
| Comparative Sample E | $6.3 \times 10^{12}$ | Fail | Fail |
| Comparative Sample F | $4.0 \times 10^9$ | Fail | Fail |

The invention has been described in detail with particular reference to certain preferred embodiments thereof, but it will be understood that variations and modifications can be effected within the spirit and scope of the invention.

What is claimed is:

1. A bar code label comprising:
   an opaque polymer film substrate having a first side and a second side;
   a first primer layer superposed on the first side of said opaque polymer film substrate;
   a light-sensitive silver halide photographic emulsion layer superposed on said first primer layer comprising silver halide grains, a hydrophilic colloid, a polymer latex, and a hardener;
   an overcoat layer superposed on said light-sensitive silver halide photographic emulsion layer comprising a hydrophilic colloid and an image stabilizer;
   a second primer layer superposed on the second side of said opaque polymer film;
   an antistatic layer superposed on said second primer layer comprising a polymeric binder and an antistatic agent;
   a pressure-sensitive adhesive layer superposed on said antistatic layer;
   a removable release sheet superposed on said pressure-sensitive adhesive layer.

2. The bar code label of claim 1, wherein said opaque polymer film substrate comprises polyethylene terephthalate and an opacifying agent.

3. The bar code lable of claim 2, wherein the opacifying agent is selected from the group consisting of organic fillers and particulate inorganic fillers.

4. The bar code label of claim 1 wherein said opaque polymer film substrate has a thickness of from 25 to 250 μm.

5. The bar code label of claim 1, wherein said first primer layer is selected from the group consisting of vinylidene chloride containing interpolymers, N-substituted monoallylamine polymers, polymeric amines and polyepoxys.

6. The bar code label of claim 1, further comprising a subbing layer interposed between said first primer layer and said light-sensitive silver halide photographic emulsion.

7. The bar code label of claim 1, wherein the polymer latex has a loading of from 0.2. to 1.5 parts per part of hydrophilic colloid.

8. The bar code label of claim 1, wherein the polymer latex comprises an interpolymer of an alkyl acrylate.

9. The bar code label of claim 1, wherein the hardener is selected from the group consisting of aziridines, carboimides, aldehydes, triazines, diazines and vinylsulfones.

10. The bar code label of claim 1 wherein said light-sensitive silver halide emulsion layer has a thickness of from 1 to 9 μm.

11.. The bar code label of claim 1, wherein hydrophilic colloid of said light-sensitive silver halide emulsion layer comprises gelatin.

12. The bar code label of claim 1, wherein said overcoat layer further comprises filter dyes, wetting aids, matting agents and lubricants.

13. The bar code label of claim 1 wherein said overcoat layer has a thickness of from 0.5 to 2 μm.

14. The bar code label of claim 1 wherein the image stabilizer comprises dithiaurazole.

15. The bar code label of claim 1, wherein said second primer layer is selected from the group consisting of vinylidene chloride containing interpolymers, N-substituted monoallyl amine polymers, polymeric amines and polyepoxys.

16. The bar code label of claim 1, further comprising a subbing layer interposed between said second primer layer and said antistatic layer.

17. The bar code label of claim 1, wherein said antistatic layer further comprises coalescing aids, wetting aids, matting agents, crosslinking agents, rheology modifiers and lubricants.

18. The bar code label of claim 1, wherein the antistatic agent is selected from the group consisting of crosslinked vinyl benzene quaternary ammonium polymers, potassium cellulose succinate salts and water-soluble interpolymers of alkali metal salts of styrene sulfonic acid.

19. The bar code label of claim 1, wherein the polymeric binder of said antistatic layer is selected from the group consisting of vinylidene-chloride containing interpolymers, and butadiene containing interpolymers.

20. The bar code label of claim 1, wherein the antistatic agent to polymeric binder ratio is from 1:10 to 2:1.

21. The bar code label of claim 1 wherein said antistatic layer has a thickness of from 0.1 to 1 μm.

22. The bar code label of claim 1, wherein the pressure-sensitive adhesive layer comprises an elastomeric polymer curable at high temperatures.

23. The bar code label of claim 22, wherein the elastomeric polymer is selected from the group consisting of EPDM rubber, styrene-butadiene rubbers, nitrile rubbers, chloroprene, acrylate elastomers or methacrylate elastomers.

24. The bar code label of claim 1, wherein said pressure-sensitive adhesive layer further comprises inorganic fillers, antioxidants, fungicides UV stabilizers and surfactants.

* * * * *